(12) United States Patent
Shimizu et al.

(10) Patent No.: US 10,090,846 B2
(45) Date of Patent: Oct. 2, 2018

(54) CONTROL APPARATUS

(71) Applicant: RENESAS ELECTRONICS CORPORATION, Tokyo (JP)

(72) Inventors: Yuji Shimizu, Tokyo (JP); Akane Hiroshima, Tokyo (JP); Yutaka Ono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/497,648

(22) Filed: Apr. 26, 2017

(65) Prior Publication Data

US 2017/0317682 A1 Nov. 2, 2017

(30) Foreign Application Priority Data

Apr. 28, 2016 (JP) .................................. 2016-090455
Jan. 24, 2017 (JP) .................................. 2017-009967

(51) Int. Cl.
| | | |
|---|---|---|
| *G01B 7/30* | (2006.01) | |
| *H03L 7/16* | (2006.01) | |
| *H02K 11/21* | (2016.01) | |
| *G01D 5/20* | (2006.01) | |
| *H03H 11/18* | (2006.01) | |

(52) U.S. Cl.
CPC ................ *H03L 7/16* (2013.01); *G01D 5/20* (2013.01); *H02K 11/21* (2016.01); *H03H 11/18* (2013.01)

(58) Field of Classification Search
CPC .. H03L 7/08; H03L 7/16; H02K 11/18; H02K 11/21; H02K 11/225; G01D 5/20; G01D 5/208; G01D 5/2046; H03M 1/485; H03M 1/645; H02P 6/14; H02P 6/16; H02P 6/28
See application file for complete search history.

(56) References Cited

U.S. PATENT DOCUMENTS 3,629,705 A * 12/1971 Walters .................... G01P 3/44
324/173
5,637,998 A 6/1997 Kushihara
6,522,097 B2 * 2/2003 Fujimoto .................. H02P 6/16
318/605

FOREIGN PATENT DOCUMENTS

| JP | H08-35856 A | 2/1996 |
|---|---|---|
| JP | H08-287173 A | 11/1996 |
| JP | 2004-347612 A | 12/2004 |

* cited by examiner

*Primary Examiner* — Minh N Tang
(74) *Attorney, Agent, or Firm* — McDermott Will & Emery LLP

(57) ABSTRACT

A control apparatus includes, for at least two-phase signals detected from a resolver excited by a carrier signal having a carrier frequency fc, a first phase shifter that shifts a phase of a first phase signal of the resolver with a pole at a frequency f1 lower than the carrier frequency fc, a second phase shifter that shifts a phase of a second phase signal of the resolver with a pole at a frequency f2 higher than the carrier frequency fc, a signal generator that generates a correction signal for canceling out an error component of the carrier signal, and a synthesizer that synthesizes the phase-shifted first phase signal, the phase-shifted second signal, and the correction signal for canceling out the error component, in order to create a phase-modulated signal that is the carrier signal being modulated at a rotation angle of a rotor of the resolver.

11 Claims, 15 Drawing Sheets

CONTROL APPARATUS

CROSS-REFERENCE TO RELATED APPLICATIONS

This application is based upon and claims the benefit of priority from Japanese patent application No. 2016-090455, filed on Apr. 28, 2016, and No. 2017-009967, filed on Jan. 24, 2017, the disclosure of which is incorporated herein in its entirety by reference.

BACKGROUND

The present invention relates to a control apparatus and a control apparatus used to control a motor.

Japanese Unexamined Patent Application Publication Nos. 8-287173 and 8-35856 disclose a method of shifting a phase of one of two-phase resolver signals obtained by single-phase excitation by 90° by a signal converter, synthesizing the resulting signal with the other one of the two-phase resolver signals, and detecting an angle of a resolver from the synthesized signal. Further, Japanese Unexamined Patent Application Publication No. 2004-347612 discloses an apparatus that detects whether there is an abnormality in a detected angle of a resolver.

SUMMARY

In the method disclosed in Japanese Unexamined Patent Application Publication Nos. 8-287173, 8-35856, and 2004-347612, however, when there are winding variations in the resolver, a carrier signal whose phase is fixed remains in the phase modulation signal as a carrier error component, which becomes a major factor in causing a position error.

The other problems of the related art and the novel characteristics of the present invention will be made apparent from the descriptions of the specification and the accompanying drawings.

According to an example aspect, a control apparatus shifts a phase of a first phase signal of a resolver with a pole at a frequency f1 lower than a carrier frequency fc, shifts a phase of a second phase signal of the resolver with a pole at a frequency f2 higher than the carrier frequency fc, synthesizes the phase-shifted first phase signal with the phase-shifted second phase signal to create a phase-modulated signal that is the carrier signal being modulated at a rotation angle of a rotor of the resolver, and adds a correction signal for canceling out an error component of the carrier signal to the phase-modulated signal.

It is possible to provide a control apparatus that can remove an error component caused by a carrier signal

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
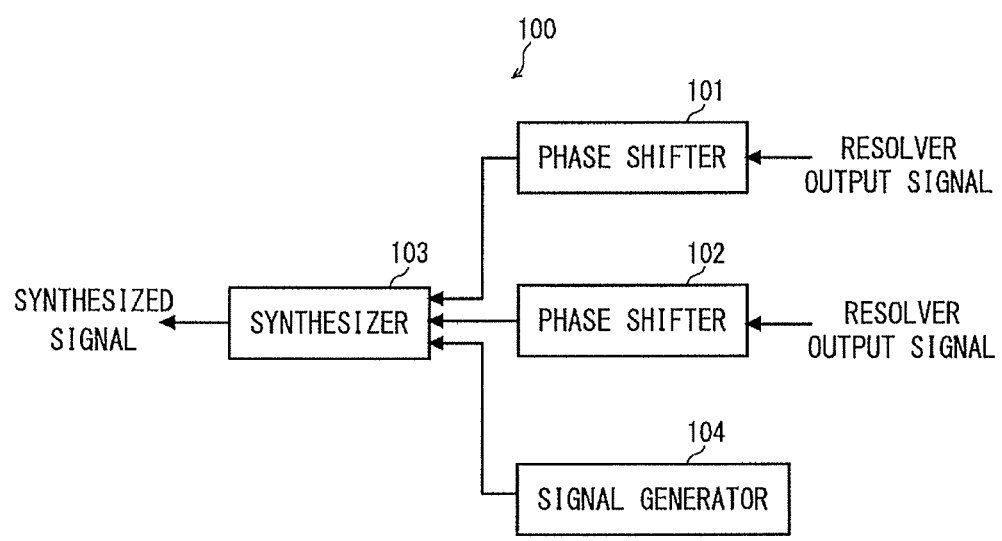
FIG. 1 is a block diagram showing a configuration of a control apparatus according to an outline of embodiments.

For the clarification of the description, the following description and the drawings may be omitted or simplified as appropriate. Further, each element shown in the drawings as functional blocks that perform various processing can be formed of a CPU, a memory, and other circuits in hardware and may be implemented by programs loaded in the memory in software. Those skilled in the art will therefore understand that these functional blocks may be implemented in various ways by only hardware, only software, or the combination thereof without any limitation. Throughout the drawings, the same components are denoted by the same reference symbols and overlapping descriptions will be omitted as appropriate.

Outline of Embodiments

FIG. 1 is a block diagram showing a configuration of a control apparatus according to an outline of embodiments. In FIG. 1, a control apparatus 100 includes a first phase shifter 101, a second phase shifter 102, a synthesizer 103, and a signal generator 104. The control apparatus 100 performs conversion processing on at least a two-phase signal output from a resolver excited with a carrier frequency fc in order to produce a predetermined phase difference between the phases of the two-phase signal.

The first phase shifter 101 shifts the phase of a first phase signal of the resolver with a pole at a frequency f1 lower than the carrier frequency fc and outputs the phase-shifted first phase signal to the synthesizer 103.

The second phase shifter 102 shifts the phase of a second phase signal of the resolver with a pole at a frequency f2 higher than the carrier frequency fc and outputs the phase-shifted second phase signal to the synthesizer 103.

The signal generator 104 generates a correction signal to cancel out an error component of a carrier signal. Then the signal generator 104 outputs the correction signal for canceling out the error component of the carrier signal to the synthesizer 103.

The synthesizer 103 synthesizes the phase-shifted first phase signal, the phase-shifted second phase signal, and the correction signal for canceling out the error component of the carrier signal, and externally outputs the synthesized signal (i.e., combined signal).

In this way, the control apparatus according to the outline of the embodiments can remove noise caused by a carrier signal by generating the correction signal for canceling out the error component caused by the carrier signal of the resolver and superimposing the correction signal on a phase-modulated signal.

First Embodiment

Figure 2:
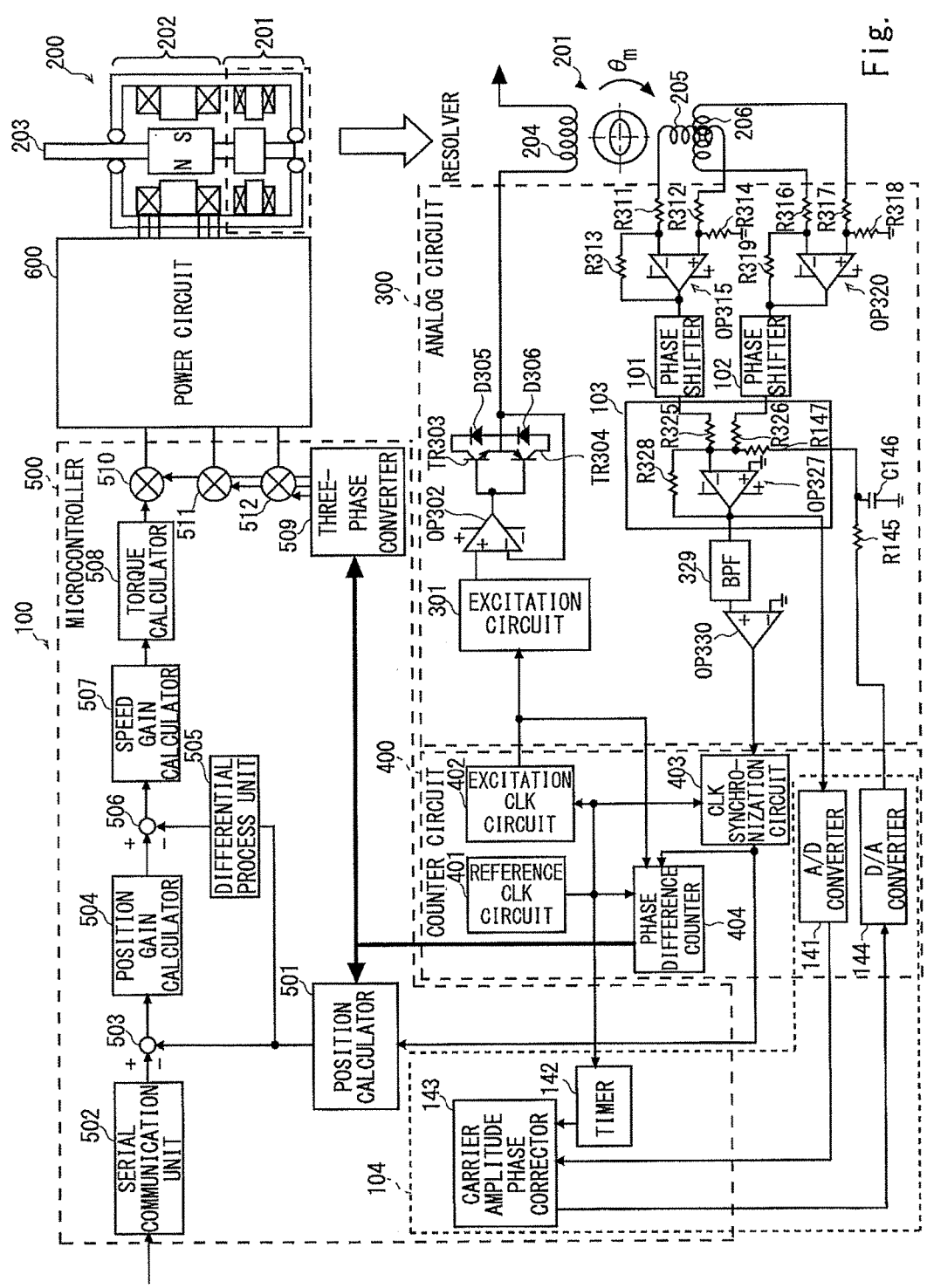
FIG. 2 is a block diagram showing a configuration of a control apparatus according to a first embodiment.

In a first embodiment, a detailed configuration of the control apparatus 100 described above in the outline of the embodiment and control of a motor using the control apparatus 100 are explained. FIG. 2 is a block diagram showing a configuration of a control apparatus according to the first embodiment. In FIG. 2, the configurations the same as those in FIG. 1 are denoted by the same reference symbols and overlapping descriptions will be omitted.

In FIG. 2, a control apparatus 200 includes an analog circuit 300, a counter circuit 400, a microcomputer controller 500, and a power circuit 600. Further, the control apparatus 200 controls the rotation of a motor 202 based on signals from a resolver 201. The rotor sections of the resolver 201 and the motor 202 are both fixed on a common rotation shaft 203 and hence the resolver 201 and the motor 202 rotate in a synchronized manner. Note that a microcomputer controller 500 and a counter circuit 400 may be formed on one semiconductor substrate to create a microprocessor chip which is a semiconductor integrated circuit apparatus, and an analog circuit 300 may be formed on one semiconductor substrate to create an analog front end which is a semiconductor integrated circuit apparatus. These microprocessor chip and the analog front end chip may be incorporated in a semiconductor apparatus which is a semiconductor package sealed with a resin. Alternatively, the microcomputer controller 500, counter circuit 400, and analog circuit 300 may be formed on one semiconductor substrate to create one semiconductor integrated circuit apparatus, and the semiconductor integrated circuit apparatus may be incorporated in a semiconductor apparatus to create one semiconductor package including the semiconductor integrated circuit apparatus sealed with a resin. The resolver 201 further includes an excitation coil 204, a detection coil 205, and a detection coil 206. The excitation coil 204 is a coil that generates a magnetic field by an electric signal that has been input. The detection coils 205 and 206 are coils that detect variations in the magnetic field and output the detected variations as electric signals.

In the resolver 201, the excitation coil 204, the detection coil 205, and the detection coil 206 are arranged in a stator part and the variations in the magnetic field are detected by a rotation of the rotor part. It is sufficient that the resolver 201 be able to detect the variations in the magnetic field due to the rotation of the rotor as an electric signal having at least two or more phases. The resolver 201 may include, for example, the excitation coil 204 arranged in the rotor part and the detection coil 205 and the detection coil 206 arranged in the stator part, and detect the variations in the magnetic field due to the rotation of the rotor part.

The detection coil 205 and the detection coil 206 are arranged to form a predetermined angle so that the detection coil 205 and the detection coil 206 detect the variations in the magnetic field as signals whose phases are different from each other. The detection coil 205 and the detection coil 206 are arranged, for example, at an angle of 90°, whereby a sinusoidal wave is detected in the detection coil 205 and a cosine wave is detected in the detection coil 206.

Next, a configuration of the analog circuit 300 will be described. The analog circuit 300 includes an excitation circuit 301, a phase shifter 101, a phase shifter 102, a signal generator 104, a band-pass filter 329, OP (OPerational) amplifiers OP302, OP315, OP320, OP327 and OP330, transistors TR303 and TR304, diodes D305 and D306, and resistors R145, R147, R311, R312, R313, R314, R316, R317, R318, R319, R325, R326 and R328, and a capacitor C146. Further, the resistors R325, R326, and R328 and the OP amplifier OP327 constitute a synthesizer 103.

The excitation circuit 301 generates a sinusoidal carrier signal having a frequency fc, which is obtained by frequency-dividing a reference clock signal, and outputs the generated carrier signal to the OP amplifier OP302.

The OP amplifier OP302, the push-pull-connected transistors TR303 and TR304, and the diodes D305 and D306 amplify the carrier signal and output the amplified carrier signal to the excitation coil 204 of the resolver 201.

The OP amplifier OP315 and the resisters R311, R312, R313 and R314 form a differential amplifier, and amplify a signal detected by the detection coil 205 and output the amplified signal to the phase shifter 101. Similarly, the OP amplifier OP320 and the resisters R316, R317, R318 and R319 form a differential amplifier, and amplify a signal detected by the detection coil 206 and output the amplified signal to the phase shifter 102.

The outputs of the phase shifters 101 and 102 are connected to each other through the resistors R325 and R326, respectively, so that a signal that is obtained by modulating the phase of the carrier frequency by the rotation angle of the rotor is provided. Further, the correction signal for canceling out the error component of the carrier signal is synthesized with the signal, the phase of which has been modulated through the resistors R145 and R147. Details of the signal synthesis are described later.

The OP amplifier OP327 and the resistor R328 form an inverting amplification circuit, amplify the signal obtained by phase modulating the carrier frequency at the rotor rotation angle and canceling out the error component of the carrier signal, and output the resulting signal to the bandpass filter 329.

The band-pass filter 329 attenuates signal components of the phase-modulated signal outside a predetermined frequency range and outputs the resultant signal to the OP amplifier OP330. The predetermined frequency range is, for example, a frequency range in which the carrier frequency can be changed according to the rotation speed of the rotor.

The OP amplifier OP330 forms a comparator, and shapes the phase-modulated signal into a square wave and outputs the shaped signal to a CLK synchronization circuit 403.

Next, a configuration of the counter circuit 400 is explained. The counter circuit 400 includes a reference CLK (CLocK) circuit 401, an excitation CLK circuit 402, a phase difference counter 404, and the CLK synchronization circuit 403.

The reference CLK circuit 401 generates a signal having a reference frequency and outputs the generated reference clock signal to the excitation CLK circuit 402, the CLK synchronization circuit 403, the phase difference counter 404, and a timer 142.

The excitation CLK circuit 402 divides the frequency of the reference clock signal generated by the reference CLK circuit 401 and thereby outputs a clock signal having a carrier frequency, which is obtained by the frequency-division, to the excitation circuit 301 and the phase difference counter 404.

The CLK synchronization circuit 403 synchronously wave-detects the shaped phase-modulated signal and the shaped carrier signal and outputs the wave-detected signal to the phase difference counter 404 and a position calculator 501.

The phase difference counter 404 counts (or measures) a phase difference obtained by the synchronous wave-detection with the resolution of the reference frequency and outputs the count result to the position calculator 501 and a three-phase converter 509.

Next, a configuration of the microcomputer controller 500 is explained. The microcomputer controller 500 includes the position calculator 501, a serial communication unit 502, a subtracter 503, a position gain calculator 504, a differential process unit 505, a subtracter 506, a speed gain calculator 507, a torque calculator 508, the three-phase converter 509, and multipliers 510, 511 and 512.

The position calculator 501 calculates a position detection value from the wave-detected signal and the count result of the phase difference and outputs the calculated position detection value to the subtracter 503 and the differential process unit 505.

The serial communication unit 502 receives an external position command signal and outputs the received position command signal to the subtracter 503. The subtracter 503 subtracts the position command signal from the position detection value and outputs the obtained position deviation to the position gain calculator 504.

The position gain calculator 504 calculates the target speed of the motor 202 by multiplying the position deviation by a predetermined position gain. The differential process unit 505 calculates the rotation speed of the motor 202 by differentiating a detected signal representing the rotational position. The subtracter 506 subtracts the speed detection value from the target speed and outputs the obtained speed deviation to the speed gain calculator 507.

The speed gain calculator 507 calculates a torque command value by multiplying the speed deviation by the speed gain. The torque calculator 508 calculates current command values representing currents that should be fed to the respective phases of the motor 202 from the torque command value. The three-phase converter 509 generates three-phase signals from the count result of the phase difference and outputs the generated three-phase signals to the respective multipliers 510, 511 and 512.

The multipliers 510, 511 and 512 generate three-phase control signals by multiplying the respective current command values by the three-phase signals and output the generated three-phase control signals to the power circuit 600. The power circuit 600 is an inverter that performs three-phase PWM (Pulse Width Modulation) control for the motor 202 based on the three-phase control signals.

Next, an internal configuration and peripheral configurations of the signal generator 104 are explained. In FIG. 2, the signal generator 104 includes an A/D (Analog-to-Digital) converter 141, the timer 142, a carrier amplitude phase corrector 143, and a D/A (Digital-to-Analog) converter 144.

The A/D converter 141 converts, from analog to digital, the signal obtained by the synthesizer 103 synthesizing the phase-shifted first phase signal, the phase-shifted second phase signal, and the correction signal for canceling out the error component of the carrier signal, and then outputs the converted signal to the carrier amplitude phase corrector 143.

The timer 142 divides the frequency of the reference clock signal generated by the reference CLK circuit 401 and outputs the signal having the divided frequency to the carrier amplitude phase corrector 143. Note that the divided frequency of the signal is the same as the frequency of the carrier signal.

The carrier amplitude phase corrector 143 generates the correction signal and outputs the correction signal to the D/A converter 144. Further, the carrier amplitude phase corrector 143 arbitrarily changes the phase and the amplitude of the correction signal so that the carrier error component becomes a minimum. Specifically, the carrier amplitude phase corrector 143 sets the amplitude and the phase of the signal obtained by the timer 142 dividing the frequency to a predetermined amplitude and a predetermined phase, respectively, to generate the correction signal. Further, the carrier amplitude phase corrector 143 changes the phase and amplitude in order to find the phase and amplitude that make the carrier error component become a minimum. Then, the carrier amplitude phase corrector 143 sets the phase and the amplitude of the correction signal so that the carrier error component becomes a minimum. Details of the operation of changing the phase and amplitude are described later.

The D/A converter 144 converts the correction signal from digital to analog and outputs the correction signal after the conversion to an inverting input terminal of the OP amplifier OP327 via the resistors R145 and R147.

In the resistor R145, one end is connected to the D/A converter 144, and the other end is connected to the resistor R147 and the capacitor C146. In the capacitor C146, one end is connected to the resistor R145, and the other end is grounded. With such a configuration, the resistor R145 and the capacitor C146 form a low-pass filter.

Figure 3:
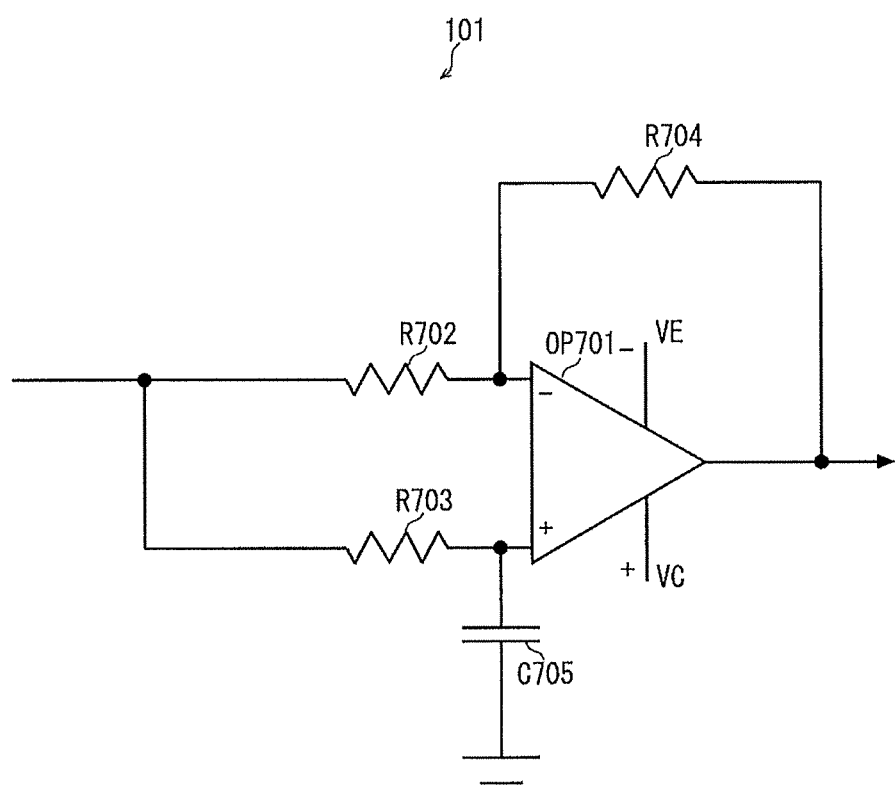
FIG. 3 is a circuit diagram showing a configuration of a phase shifter according to the first embodiment.

With the above-described configuration, the control apparatus 200 detects the rotation angle of the rotor and controls the motor. However, it should be noted that any configuration capable of shifting a phase can be used as each of the phase shifters 101 and 102, which are components disposed in the control apparatus 200. For example, an all-pass filter using an OP amplifier is a preferred configuration capable of shifting a phase. This phase shifter using an OP amplifier is explained with reference to FIG. 3. FIG. 3 is a circuit diagram showing a configuration of a phase shifter according to the first embodiment. In FIG. 3, the phase shifter 101 includes an OP amplifier OP701, resistors R702, R703, and R704, and a capacitor C705.

A signal output from the detection coil 205 of the resolver 201 is input to the inverting input terminal of the OP amplifier OP701 through the resistor R702 and also input to the non-inverting input terminal of the OP amplifier OP701 through the resistor R703. Further, the non-inverting input terminal of the OP amplifier OP701 is connected to the ground through the capacitor C705. Further, the output terminal of the OP amplifier OP701 is connected to the inverting input terminal of the OP amplifier OP701 through the resistor R704.

With the above-described configuration, the phase shifter 101 forms an all-pass filter using an OP amplifier. A similar configuration can be used for the phase shifter 102.

The phase shift and the pole can be determined by the transfer function of the all-pass filter. Therefore, the impedance of the resistor R703 and the capacitance of the capacitor C705 are determined based on a desired phase shift and a desired pole.

Note that the difference between the phase shifts of the phase shifters 101 and 102 can be adjusted to 90° by adjusting the carrier frequency fc, the frequency f1 of the pole of the phase shifter 101, and the frequency f2 of the pole of the phase shifter 102 so that they satisfy relations "f1=fc/n" and "f2=fc×n" (n is an arbitrary positive real number).

For example, by adjusting the impedance of each of the resistors R702, R703 and R704 to 100 kΩ and adjusting the capacitance of the capacitor C705 to 80 pF, the frequency f1 can be adjusted to 1.99 kHz (f1=1.99 kHz). Further, by adjusting the impedance of each of the resistors R702, R703 and R704 to 100 kΩ and adjusting the capacitance of the capacitor C705 to 135 pF, the frequency f2 can be adjusted to 11.8 kHz (f1=11.8 kHz).

When the carrier frequency fc is 4.88 kHz (fc=4.88 kHz), the above-described frequencies f1 and f2 (f1=1.99 kHz, f2=11.8 kHz) satisfy the relations "f1=fc/n" and "f2=fc×n" (n is an arbitrary positive real number). Therefore, the difference between the phase shifts of the phase shifters 101 and 102 becomes 90°.

Next, a process for detecting a rotation angle is explained with reference to FIG. 2. Firstly, a carrier signal generated by the excitation circuit 301 is amplified by the OP amplifier OP302 and the transistors TR303 and TR304, and the amplified carrier signal is input to the excitation coil 204.

The magnetic field generated by the excitation coil 204 fluctuates due to the rotation of the rotor section of the resolver 201. Then, the fluctuations in the magnetic field are detected by the detection coils 205 and 206.

When the exciting coil 204 is excited by a carrier signal of a sinusoidal wave sin ωt by a single-phase excitation and two-phase output signals detected in the detection coils 205 and 206 are amplified, for example, two-phase output signals X1 and X2 after the amplification are defined by the following formulas.

$$X1 = n \cdot E_0 \cdot \sin\theta \times \sin\omega t$$

$$X2 = n \cdot E_0 \cdot \cos\theta \times \sin\omega t$$

In the above-shown formulas: ω is the angular momentum (angular speed) of the carrier signal; t is a time; θ is the rotation angle of the rotor of the resolver 201; $E_0$ is an amplitude of the carrier signal, and n is a transformation ratio.

When the phase shifts of the phase shifters 101 and 102 are represented by φ1 and φ2, respectively, and an all-pass filter is used for each of the phase shifters 101 and 102, the control apparatus 100 can be designed so that a relation "φ1−φ2=−90°" is satisfied. For example, by adjusting the frequencies of the poles of the phase shifters 101 and 102 to 1.99 kHz and 11.8 kHz, respectively, for the carrier frequency fc of 4.88 kHz (fc=4.88 kHz), the relation "φ1−φ2=−90°" can be satisfied.

Further, the filtered signals in the phase shifters 101 and 102 are defined as follows.

$$X1 = n \cdot E_0 \cdot \sin\theta \times \sin(\omega t - \varphi 1)$$

$$X2 = n \cdot E_0 \cdot \cos\theta \times \sin(\omega t - \varphi 2)$$

The following relation can be derived from the relation "−φ2=−φ1−90°".

$$X2 = n \cdot E_0 \cdot \cos\theta m \times \sin(\omega t - \varphi 1 - 90°)$$

$$= -n \cdot E_0 \cdot \cos\theta m \times \cos(\omega t - \varphi 1)$$

In the synthesizer 103, the signals X1 and X2, which are phase-shifted in the phase shifters 101 and 102, are synthesized with each other. Then the following relation can be derived by adding X1 and X2.

$$Y = X1 + X2$$

$$= n \cdot E_0 \cdot \sin\theta \times \sin(\omega t - \varphi 1) - n \cdot E_0 \cdot \cos\theta \times \cos(\omega t - \varphi 1)$$

$$= -n \cdot E_0 \cdot \cos(\omega t - \varphi 1 + \theta m)$$

Figure 4:
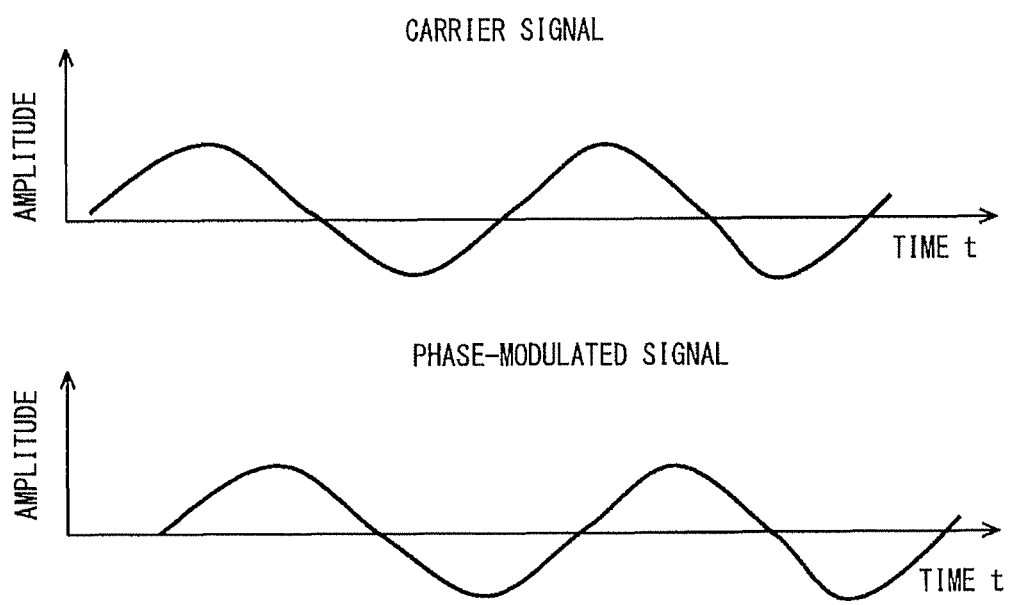
FIG. 4 is graphs showing examples of a carrier signal and a phase-modulated signal.

That is, a signal that is obtained by modulating the phase of the carrier frequency (angular frequency) ω by the rotation angle θ of the rotor is provided. FIG. 4 is a graph showing an example of the carrier signal and the phase-modulated signal. In FIG. 4, the vertical axis indicates amplitudes and the horizontal axis indicates time. As shown in FIG. 4, the carrier signal and the phase-modulated signal are signals having the same frequency and different phases. Therefore, it is possible to calculate the rotation angle of the rotor based on the phase difference between the carrier signal and the phase-modulated signal.

Figure 5:
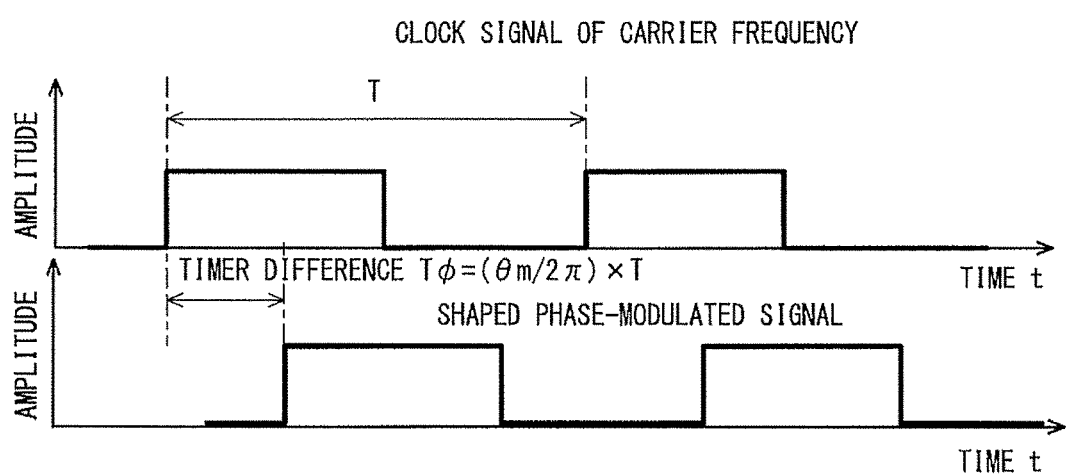
FIG. 5 is a graph showing a phase difference between a clock signal of a carrier frequency and a shaped phase-modulated signal.

Preferably, the phase-modulated signal is shaped into a square wave in order to detect the phase difference between the shaped phase-modulated signal and the clock signal having the carrier frequency. FIG. 5 is a graph showing a phase difference between the clock signal having the carrier frequency and the shaped phase-modulated signal. In FIG. 5, the vertical axis indicates amplitudes and the horizontal axis indicates time. As shown in FIG. 5, there is a phase difference between the clock signal having the carrier frequency and the shaped phase-modulated signal, which corresponds to the rotation angle of the rotor.

In the CLK synchronization circuit 403, a wave-detected signal is obtained by synchronizing the signal that is obtained by modulating the phase of the carrier frequency ω by the rotation angle θm of the rotor with the clock signal having the carrier frequency.

According to the above-described method of calculating the rotor rotation angle, the phase of the first phase signal of the resolver is shifted with the pole at the frequency f1, which is higher than the carrier frequency fc, the phase of the second phase signal of the resolver is shifted with the pole at the frequency f2, which is higher than the carrier frequency fc, and the phase-shifted first phase signal is synthesized with the phase-shifted second phase signal. As a result, it is possible to provide a control apparatus having excellent detected-angle accuracy and a small circuit size.

The motor is controlled based on the obtained detected signal in the microcomputer controller 500 and the power circuit 600.

Figure 6:
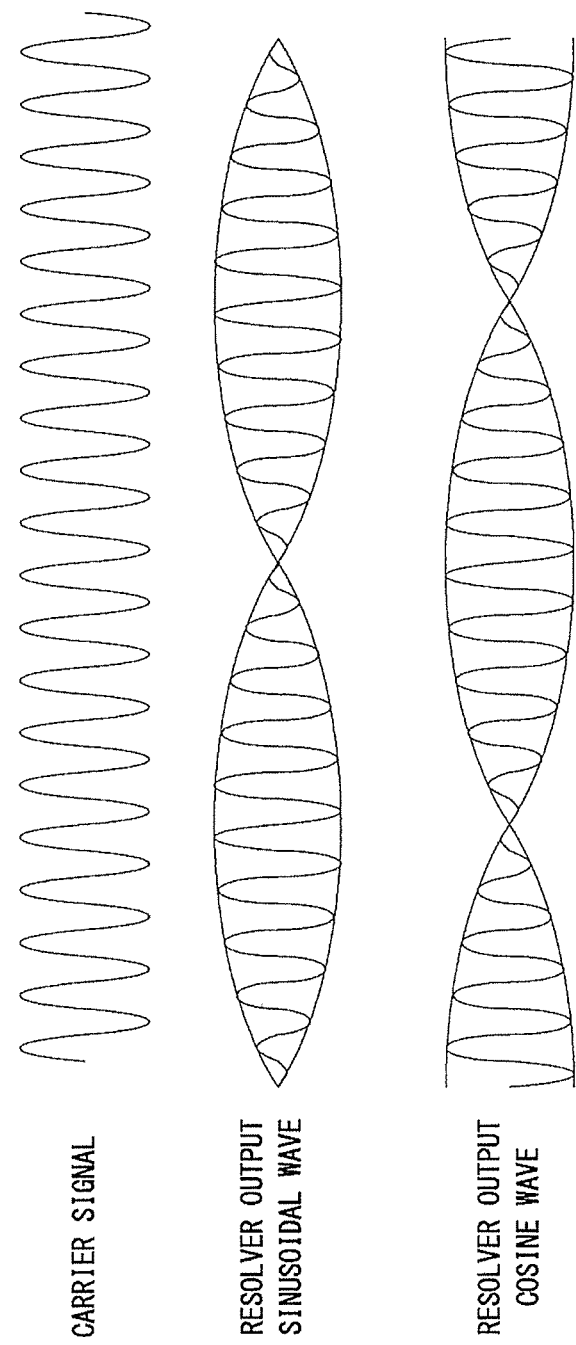
FIG. 6 is a drawing showing an example of a carrier signal and a resolver signal with no carrier error component.

Next, the error component of the carrier signal is explained. FIG. 6 is a drawing showing examples of the carrier signal and the resolver signal having no carrier error component. In FIG. 6, the vertical axis indicates amplitudes, and the horizontal axis represents time. When the carrier error component is not present, as shown in FIG. 6, the resolver signal is a phase-modulated signal obtained by the carrier signal being modulated at the rotation angle of the rotor of the resolver and has sinusoidal and cosine waveforms. Moreover, an envelope of the resolver signal is also noiseless.

Figure 7:
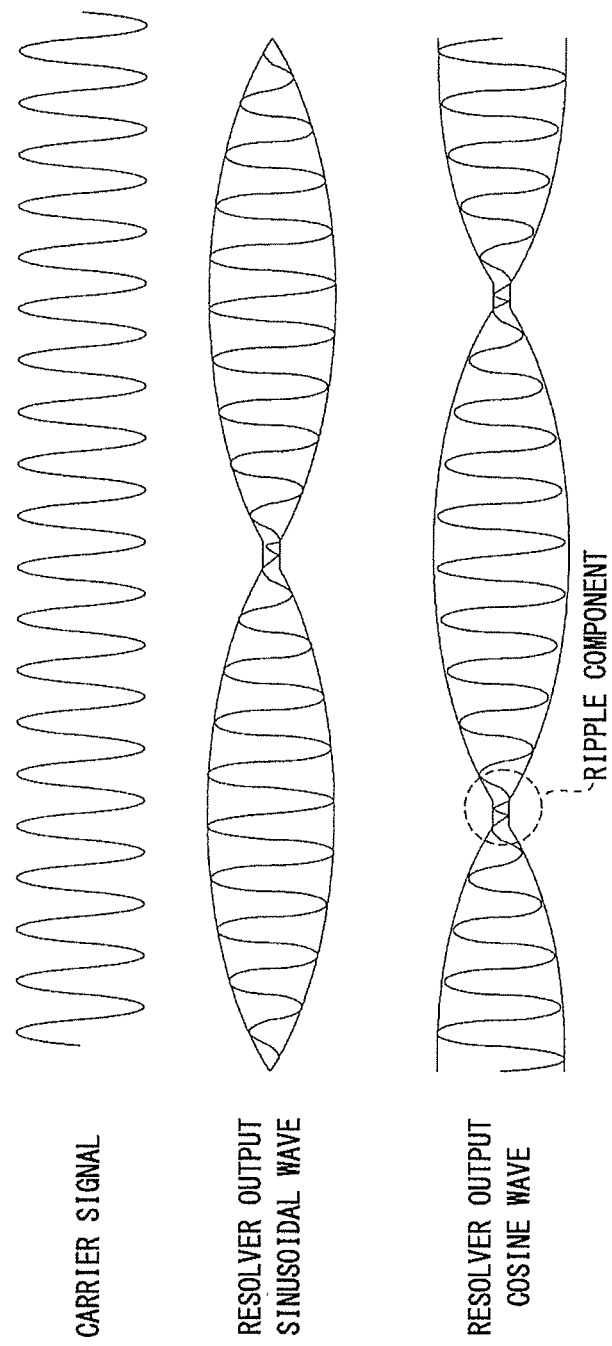
FIG. 7 is a drawing showing an example of a carrier signal and a resolver signal including a carrier error component.

On the other hand, if the winding in the resolver is not uniform, a carrier signal having a fixed phase remains in the phase-modulated signal as a carrier error component (remaining component). FIG. 7 is a drawing showing an example of the carrier signal and the resolver signal when the carrier error component is present therein. In FIG. 7, the vertical axis indicates amplitudes, and the horizontal axis represents time. When the carrier error component is present, as shown in FIG. 7, the resolver signal becomes the phase-modulated signal, which is the carrier signal including the carrier error component being modulated at the rotation angle of the rotor of the resolver, and thus the carrier error component is also modulated at the rotation angle of the rotor.

When the carrier error component is present, two-phase output signals X1 and X2 are defined as follows.

$$X1 = n \cdot E_0 \cdot (\alpha + \sin\theta) \times \sin\omega t$$

$$X2 = n \cdot E_0 \cdot (\beta + \cos\theta) \times \sin\omega t$$

In the above-shown formulas: $\omega$ is the angular momentum (angular speed) of the carrier signal; $t$ is a time; $\theta$ is the rotation angle of the rotor of the resolver $201$; $E_0$ is an amplitude of the carrier signal, n is a transformation ratio; and $\alpha$ and $\beta$ are error components.

Moreover, the signals filtered by the phase shifters 101 and 102 are defined as follows.

$$X1 = n \cdot E_0 \cdot (\alpha + \sin\theta) \times \sin(\omega t - \varphi 1)$$

$$X2 = n \cdot E_0 \cdot (\beta + \cos\theta) \times \sin(\omega t - \varphi 2)$$

The following relation can be derived from the relation "$-\varphi 2 = -\varphi 1 - 90°$".

$$X2 = n \cdot E_0 \cdot (\beta + \cos\theta) \times \sin(\omega t - \varphi 1 - 90°)$$

$$= -n \cdot E_0 \cdot (\beta + \cos\theta) \times \cos(\omega t - \varphi 1)$$

In the synthesizer 103, the signals X1 and X2, which are phase-shifted in the phase shifters 101 and 102, are synthesized with each other. Then the following relation can be derived by adding X1 and X2.

$$Y = X1 + X2$$

$$= n \cdot E_0 \cdot (\alpha + \sin\theta) \times \sin(\omega t - \varphi 1) - n \cdot E_0 \cdot (\beta + \cos\theta) \times \cos(\omega t - \varphi 1)$$

Consequently, after the signals X1 and X2 are synthesized, the following formula can be derived. The second term of the following formula corresponds to the carrier error component. The signal generator 104 generates the correction signal for canceling out the error component that is represented by the second term of the following formula.

$$n \cdot E_0 \cdot \left\{ -\cos(\omega t - \phi_1 + \theta) + \sqrt{\alpha^2 + \beta^2} \cdot \sin\left(\omega t - \phi_1 - \tan^{-1}\frac{\beta}{\alpha}\right) \right\} \quad \text{[Formula 1]}$$

Figure 8:
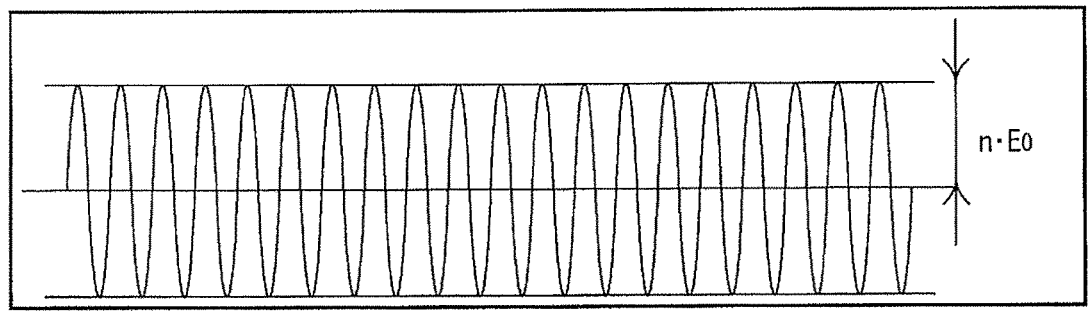
FIG. 8 is a drawing showing an example of a synthesized signal with no carrier error component.
Figure 9:
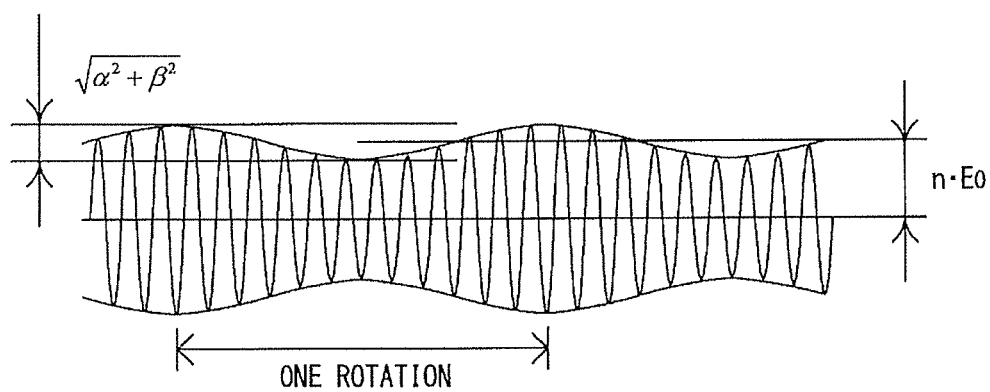
FIG. 9 is a drawing showing an example of a synthesized signal with a carrier error component.

FIGS. 8 and 9 respectively show the case when the carrier error component is present in the signal synthesized by the synthesizer 103 and the case when the carrier error component is not present in the signal synthesized by the synthesizer 103. FIG. 8 is a drawing showing an example of the synthesized signal with no carrier error component. In FIG. 8, the vertical axis indicates amplitudes, and the horizontal axis represents time. When the carrier error component is not present, as shown in FIG. 8, the synthesized signal is a phase-modulated signal, which is the carrier signal being modulated at the rotation angle of the rotor of the resolver and has a cosine waveform.

FIG. 9 is a drawing showing an example of a synthesized signal including the carrier error component. In FIG. 9, the vertical axis represents amplitudes, and the horizontal axis represents time. When the carrier error component is present, as shown in FIG. 9, the synchronized signal has a waveform obtained by adding the carrier error component to the phase-modulated signal, which is the carrier signal being modulated at the rotation angle of the rotor of the resolver. The control apparatus 100 cancels out this carrier error component.

Figure 10:
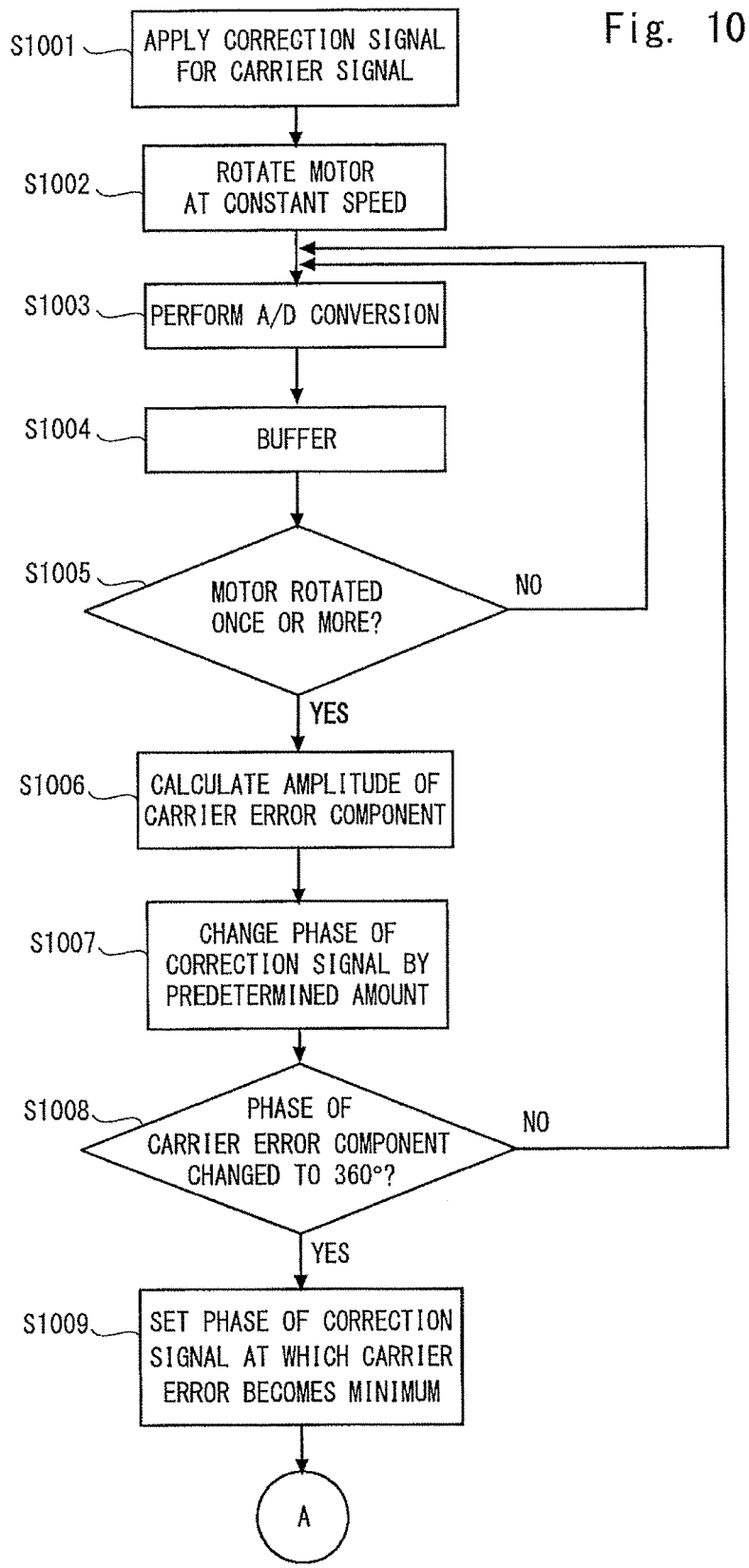
FIG. 10 is a flowchart showing an example of an operation of the control apparatus according to the first embodiment.
Figure 11:
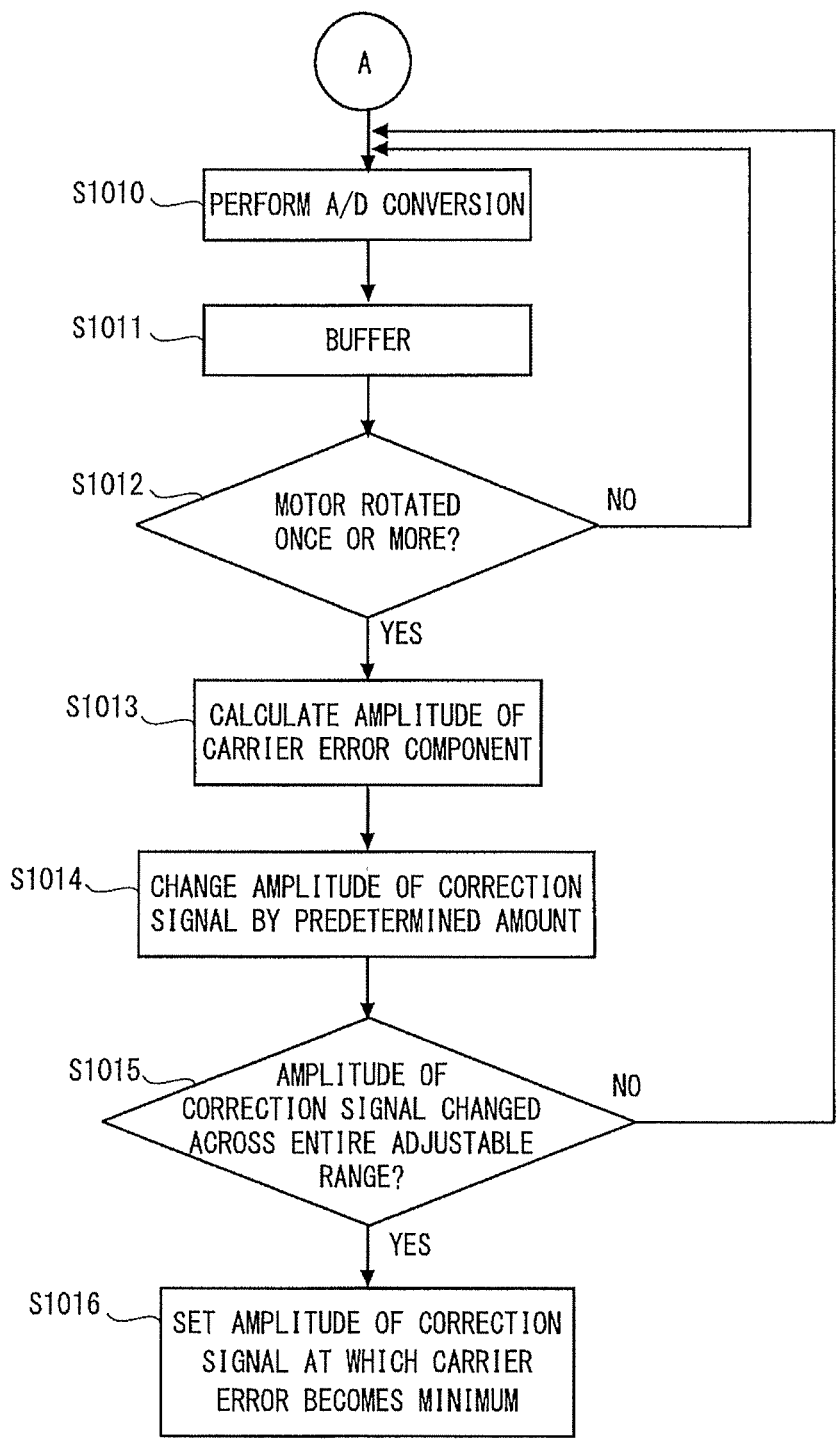
FIG. 11 is a flowchart showing an example of an operation of the control apparatus according to the first embodiment.

Next, an operation of the control apparatus 100 is explained. FIGS. 10 and 11 are flowcharts showing an example of the operation of the control apparatus according to the first embodiment.

Firstly, in Step S1001, the carrier signal is applied to the excitation coil 204 of the resolver 201, and the correction signal having initialized amplitude and phase is applied to the synthesizer 104. Then the process proceeds to Step S1002.

In Step S1002, the motor 202 is continuously rotated at a constant speed, and the process proceeds to Step S1003.

In Step S1003, the signal synthesized in the synthesizer 103 is converted from analog to digital, and the process proceeds to Step S1004.

In Step S1004, the synthesized signal that has been converted from analog to digital is buffered to the carrier amplitude phase corrector 143 by different phases, and the process proceeds to Step S1005.

In Step S1005, when the motor 202 is rotated once, the process proceeds to Step S1006, whereas when the motor 202 is not rotated once, the process returns to Step S1003.

In Step S1006, the amplitude of the carrier error component (remaining error) is calculated using a difference between maximum and minimum values of a peak value of the synthesized signal buffered to the carrier amplitude phase corrector 143, and the process proceeds to Step S1007.

In Step S1007, the phase of the correction signal is changed by a predetermined amount (by the unit of a predetermined angle) in the carrier amplitude phase corrector 143, and the process proceeds to Step S1008.

In Step S1008, it is evaluated as to whether or not the change in the phase of the correction signal reaches 360° in the carrier amplitude phase corrector 143. If the change in the phase of the correction signal reaches 360°, the process proceeds to Step S1009, whereas if the change in the phase of the correction signal has not reached 360°, the process returns to Step S1003.

In Step S1009, the phase of the correction signal at which the carrier error component becomes a minimum is determined in the carrier amplitude phase corrector 143. Specifically, the processes from Steps S1003 to S1008 are performed at angles from 0° to 360° by different phases, and the phase at which the carrier error component becomes a minimum is set to be the phase of the correction signal. The processes from Step S1010 onward are performed by the correction signal having this set phase.

In Step S1010, the synthesized signal obtained by synthesizing the correction signal having the phase set in Step S1009, the phase-shifted first phase signal, and the phase-shifted second phase signal is converted from analog to digital at a peak timing, and the process proceeds to Step S1011.

In Step S1011, the synthesized signal, which has been converted from analog to digital, is buffered to the carrier amplitude phase corrector 143 by different phases, and the process proceeds to Step S1012.

In Step S1012, when the motor 202 is rotated once, the process proceeds to Step S1013, whereas when the motor 202 is not rotated once, the process returns to Step S1010.

In Step S1013, the amplitude of the carrier error component (remaining error) is calculated using a difference between maximum and minimum values of a peak value of the synthesized signal buffered to the carrier amplitude phase corrector 143, and the process proceeds to Step S1014.

In Step S1014, the amplitude of the correction signal is changed by a predetermined amount in the carrier amplitude phase corrector 143, and the process proceeds to Step S1015.

In Step S1015, it is evaluated as to whether or not the change in the amplitude of the correction signal has been performed within the entire adjustable range in the carrier amplitude phase corrector 143. If the change in the amplitude of the correction signal has been performed across the entire adjustable range, the process proceeds to Step S1016. On the contrary, if the change in the amplitude of the correction signal has not been performed across the entire adjustable range, the process returns to Step S1010.

In Step S1016, the amplitude of the correction signal at which the carrier error component becomes a minimum is determined in the carrier amplitude phase corrector 143, and the process of setting the amplitude and the phase is completed. Specifically, the processes from Steps S1010 to S1015 is performed on all of the amplitudes in the adjustable range, and the amplitude at which the carrier error component becomes a minimum is set to be the amplitude of the correction signal.

The above-described operation is a calibration operation performed at when the product is shipped, and hence may be performed only once. Therefore, the values set for the phase and the amplitude may be stored in a nonvolatile memory included in the microcomputer controller 500. Further, the above-described operation may be performed after the shipment. For example, the above-described operation may be performed during the initialization operation upon the power-up or the like.

As described above, the control apparatus according to the first embodiment can remove the noise caused by the carrier signal of the resolver by generating the correction signal for canceling out the carrier error component (remaining component) of the resolver generated due to the influence of an error in winding, searching for a phase and an amplitude for the correction signal by which the error component is minimized, and superposing the correction signal on the phase-modulated signal.

Second Embodiment

Figure 12:
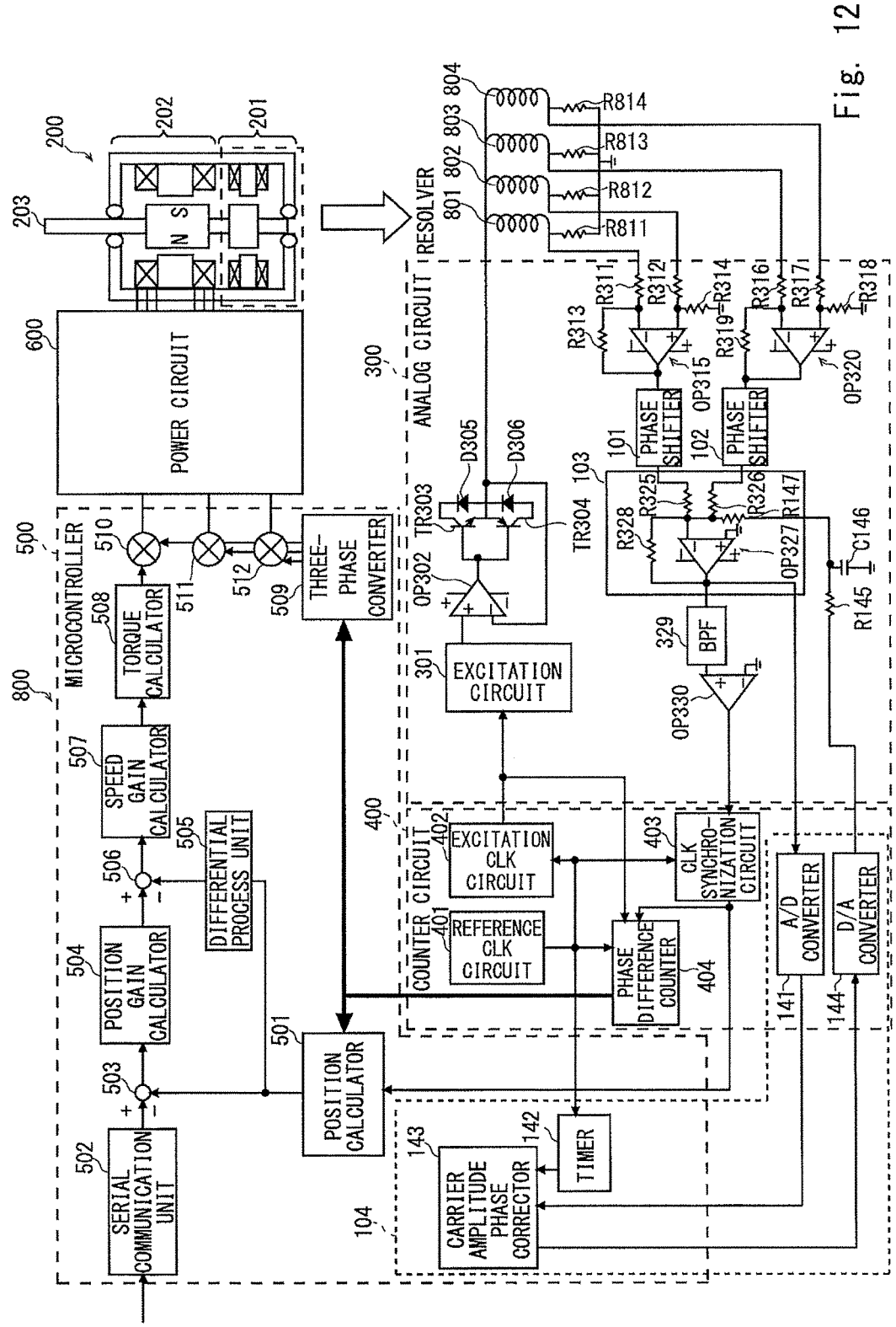
FIG. 12 is a block diagram showing configurations of a signal converter and a control apparatus according to a second embodiment.

In a second embodiment, an example in which a four-phase coil is used as the resolver is described. FIG. 12 is a block diagram showing configurations of a signal converter and a control apparatus according to the second embodiment.

In FIG. 12, the configurations the same as those in FIG. 2 are denoted by the same reference symbols and overlapping descriptions will be omitted. In FIG. 12, a control apparatus 800 includes coils 801, 802, 803, and 804 and resistors R811, R812, R813, and R814.

The excitation circuit 301 generates a sinusoidal carrier signal at the frequency fc at which the reference clock signal is divided and outputs the carrier signal to the OP amplifier OP302. The OP amplifier OP302, the transistors TR303 and TR304 connected in push-pull connection, and the diodes D305 and D306 amplify the carrier signal and output the carrier signal after the amplification to the coils 801, 802, 803, and 804 of the resolver 201.

The coil 801 has one end connected to the output of the amplification circuit formed of the OP amplifier OP302 and the transistors TR303 and TR304 connected in push-pull connection and the other end connected to an inverting input terminal of the OP amplifier OP315.

The coil 803 has one end connected to the output of the amplification circuit formed of the OP amplifier OP302 and the transistors TR303 and TR304 connected in push-pull connection and the other end connected to an inverting input terminal of the OP amplifier OP315.

The OP amplifier OP315 forms a differential amplifier that carries out differential amplification of outputs of the 0-phase coil 801 and the 180-phase coil 803.

In a similar way, the coil 802 has one end connected to the output of the amplification circuit formed of the OP amplifier OP302 and the transistors TR303 and TR304 connected in push-pull connection and the other end connected to an inverting input terminal of the OP amplifier OP320.

Further, the coil 804 has one end connected to the output of the amplification circuit formed of the OP amplifier OP302 and the transistors TR303 and TR304 connected in push-pull connection and the other end connected to a non-inverting input terminal of the OP amplifier OP320.

The OP amplifier OP320 forms a differential amplifier that carries out differential amplification of outputs of the 90-phase coil 802 and the 270-phase coil 804.

As described above, the signal converter and the control apparatus according to the second embodiment are able to accurately detect the rotation angle of the rotor using a four-phase coil for the resolver.

Third Embodiment

Figure 13:
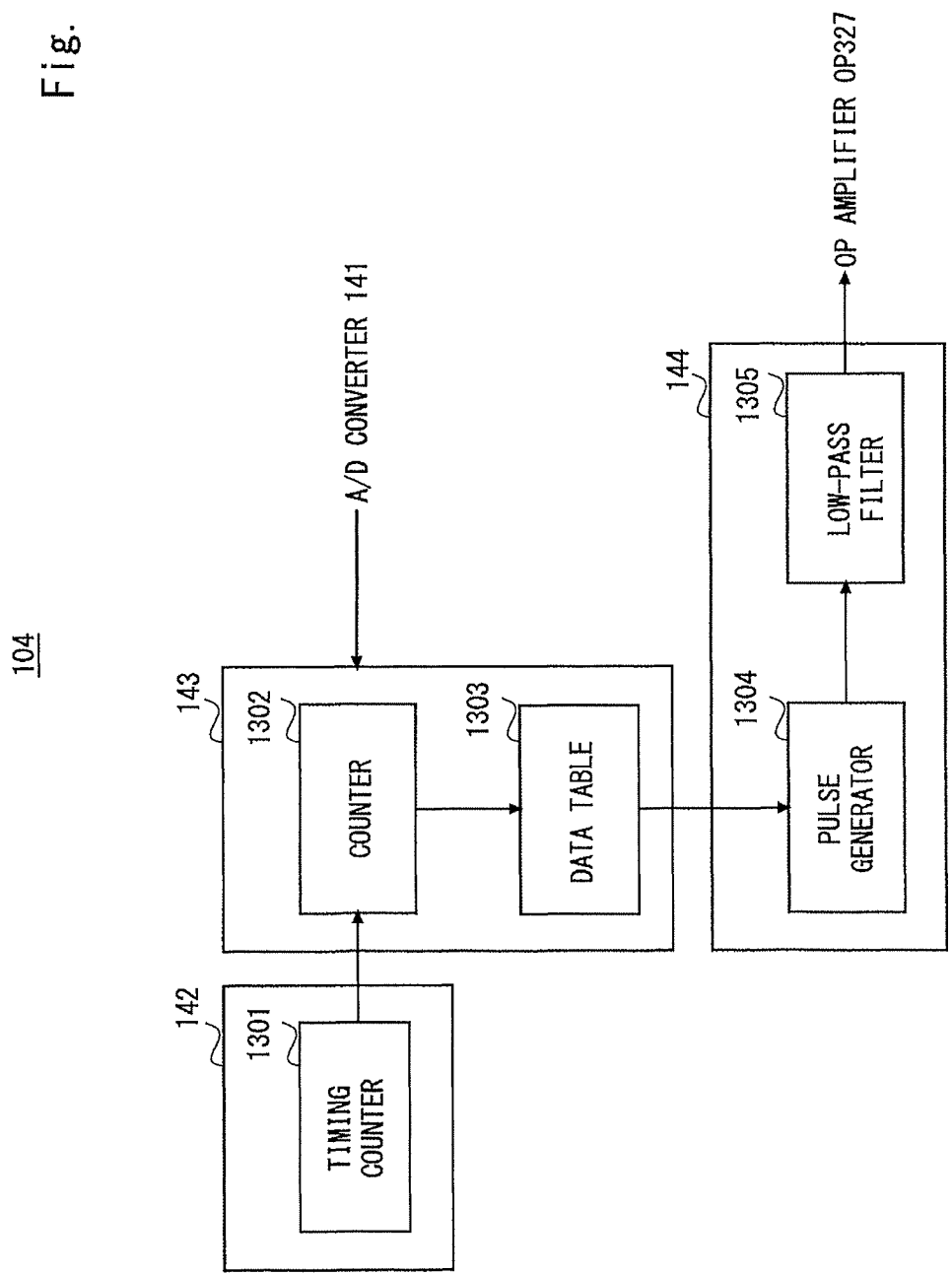
FIG. 13 is a block diagram showing a configuration of a signal generator according to a third embodiment.

In a third embodiment, a specific configuration of the signal generator 104 according to the first or second embodiment is described. FIG. 13 is a block diagram showing the configuration of the signal generator according to the third embodiment. In FIG. 13, the signal generator 104 includes the A/D converter 141, the timer 142, the carrier amplitude phase corrector 143, and the D/A converter 144. The timer 142 includes a timing counter 1301. The carrier amplitude phase corrector 143 includes a counter 1302 and a data table 1303. The D/A converter 144 includes a pulse generator 1304 and a low-pass filter 1305.

The timing counter 1301 divides the frequency of the reference clock signal and outputs the signal having the divided frequency to the counter 1302. The signal having the divided frequency is a timing signal for changing a PWM Duty. A CMI (Compere Match Interrupt) 1 interrupt process is performed based on this signal.

The counter 1302 counts the number of times signals for CMI1 interrupt are received as a PWM Duty data specifying counter and outputs it to the data table 1303.

The data table 1303 stores associations between the PWM Duty data specifying counters and patterns of sinusoidal waves respectively corresponding to the PWM Duty data specifying counters. Then the data table 1303 outputs the pattern of the sinusoidal wave corresponding to the PWM Duty data specifying counter to the pulse generator 1304.

For example, when the counter 1302 counts the PWM Duty data specifying counter from 0 to 99, the data table 1303 stores 100 patterns of sinusoidal waves from 0 to 99. Note that the patterns of the sinusoidal waves may be desired patterns as long as they define waveforms and cycles.

The pulse generator 1304 generates a PWM pulse signal based on the pattern of the sinusoidal wave output from the counter 1302. Further, the pulse generator 1304 outputs the PWM pulse signal to the low-pass filter 1305. When the pattern of the sinusoidal wave output from the counter 1302 is changed, the pulse generator 1304 generates the PWM pulse signal having a waveform in which the changed pattern of the sinusoidal wave is repeated.

The low-pass filter 1305 attenuates a high frequency component of the PWM pulse signal generated by the pulse generator 1304. The attenuated correction signal is output to the inverting input terminal of the OP amplifier OP327 through the resistors R145 and R147.

With the above-described configuration, the signal generator 104 can change the phase of the correction signal. The signal generator 104 can change the phase of the correction signal by changing an initial value of the data specifying counter (corresponding to an index of the data table) while monitoring a result of amplitude measurement performed by the A/D converter 141. It should be noted that the signal generator 104 can also change the amplitude of the correction signal by changing a coefficient to be multiplied by data table values or by referring to another sinusoidal wave generation table while monitoring the result of the amplitude measurement performed by the A/D converter 141.

Figure 14:
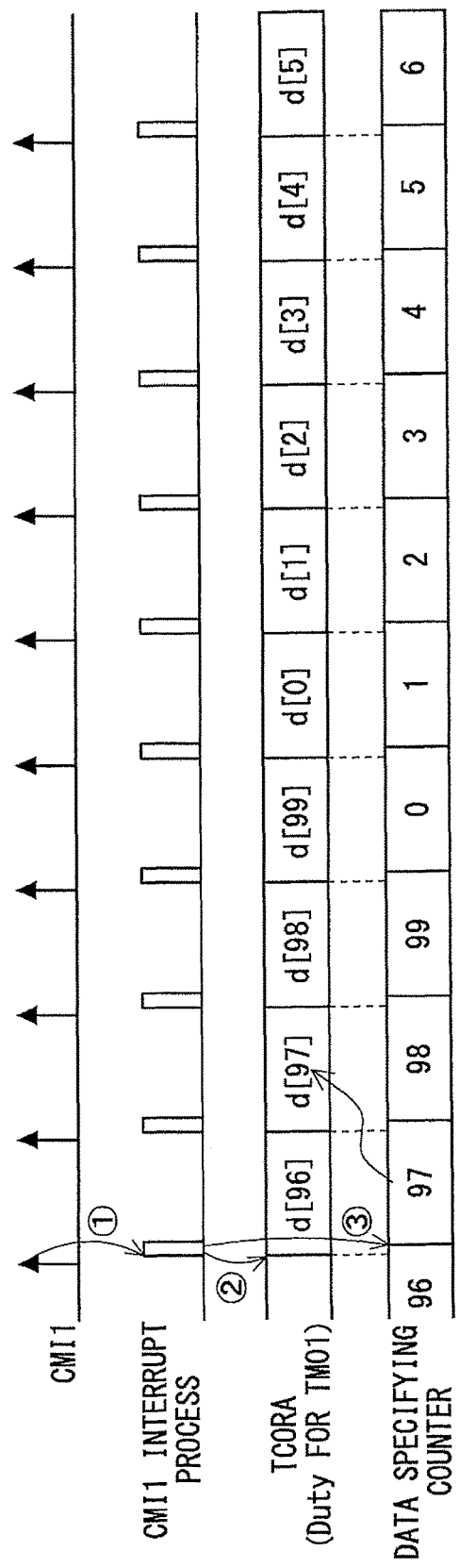
FIG. 14 is a timing chart showing timings for changing a PWM duty of a correction signal.

Next, an operation of the signal generator 104 is described. FIG. 14 is a timing chart showing a timing for changing the PWM duty of the correction signal. In FIG. 14, the horizontal axis indicates time. Moreover, in FIG. 14, the drawings show a CMI1 signal, the CMI1 interrupt process, TCORA (Time COnstant Register A), and the data specifying counter in this order from the top.

In the signal generator 104, the CMI1 signals are output from the timing counter 1301 to the counter 1302 at predetermined intervals. When the interrupt process by the CMI1 signal occurs, the TCORA is rewritten by the value of the data table set by the PWM Duty data specifying counter. That is, the counter 1302 counts up the data specifying counter. The data specifying counter, which has been counted up, is reflected in the TCORA in the next CMI1 interrupt process.

By the above-described operations, the signal generator 104 can change the pattern of the sinusoidal wave every time the interrupt process occurs.

Figure 15:
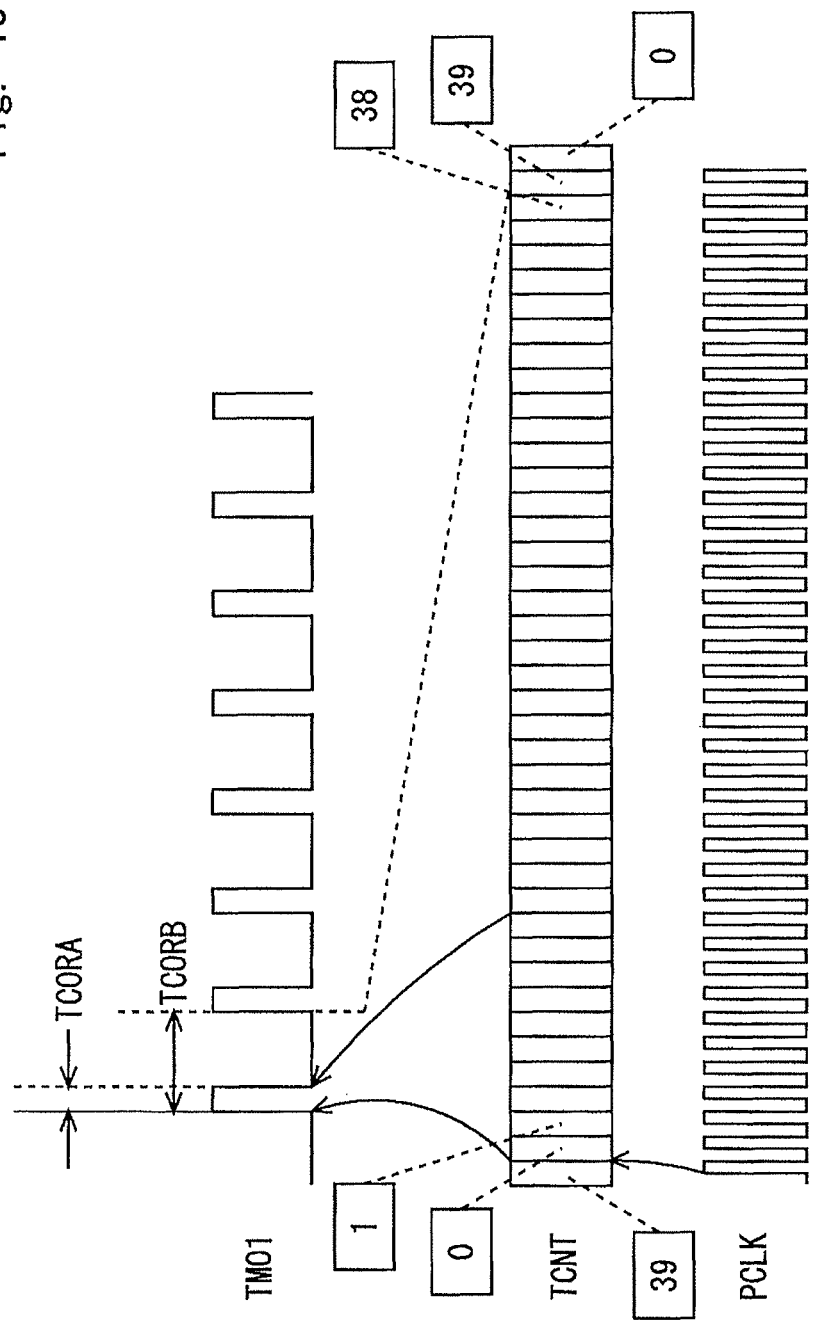
FIG. 15 is a timing chart showing a pulse timing.

Next, a PWM pulse timing is described. FIG. 15 is a timing chart showing the PWM pulse timing. In FIG. 15, the horizontal axis indicates time. Moreover, in FIG. 15, the drawings show TMO1 (TiMe Out 1), TCNT (Timer CouNter), and PCLK (Peripheral CLocK) from the top. The TCNT corresponds to a minimum section of the PWM pulse signal.

In FIG. 15, an example in which an amplitude of the PWM pulse signal is changed with a resolution of the PWM duty of 40 is described.

As shown in FIG. 15, the TCORA is a period when the signal is on in the PWM pulse shown by TMO1. Accordingly, the amplitude of the signal can be controlled by changing the TCORA. Further, TCORB (Time COnstant Register B) represents a period of the PWM pulse.

When the resolution of the PWM duty is 40, the TCORA falls within a range of 1/40 to 40/40 of the TCORB. The amplitude can be controlled by changing the TCORA to thereby change the duty ratio of the PWM pulse.

As described above, the signal generator according to the third embodiment can change a phase and/or an amplitude of the correction signal by counting the number of times the timing to change the PWM duty is interrupted and generating the PWM pulse signal based on the pattern of the sinusoidal wave corresponding to the counted value.

In each of the aforementioned embodiments, the counter circuit 400 and the microcomputer controller 500 may be executed by a hardware such as an Application Specific Integrated Circuit (ASIC) or software. Further, some of the processing may be executed by software and the other processing may be executed by hardware. When the processing is executed by software, a computer system such as a microprocessor including one or a plurality of central processing units (CPUs) may execute a program regarding processing of the functional blocks.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The present invention made by the inventors has been explained above in a specific manner based on embodiments. However, the present invention is not limited to the above-described embodiments, and needless to say, various modifications can be made without departing from the spirit and scope of the present invention.

For example, each of the carrier frequency and the phase shift is not limited to the values in the above-described embodiments.

The first, second, and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A control apparatus comprising:
   for at least two-phase signals detected by a resolver excited by a carrier signal having a carrier frequency fc,
   a first phase shifter configured to shift a phase of a first phase signal of the resolver with a pole at a frequency f1 lower than the carrier frequency fc;
   a second phase shifter configured to shift a phase of a second phase signal of the resolver with a pole at a frequency f2 higher than the carrier frequency fc;
   a signal generator configured to generate a correction signal for canceling out an error component in a carrier signal; and
   a synthesizer configured to synthesize the phase-shifted first phase signal, the phase-shifted second phase signal, and the correction signal for canceling out the error component and output the resultant signal as a phase-modulated signal obtained by modulating the carrier signal by a rotation angle of a rotor of the resolver.

2. The control apparatus according to claim 1, wherein the signal generator comprises a carrier amplitude phase corrector that arbitrarily changes a phase and an amplitude of the correction signal at which the carrier component becomes a minimum.

3. The control apparatus according to claim 2, wherein a frequency of the correction signal is the same as the carrier frequency fc, the phase and the amplitude of the correction signal being arbitrarily changed by the carrier amplitude phase corrector.

4. The control apparatus according to claim 2, wherein the carrier amplitude phase corrector changes the phase within the range of 0° to 360° by a unit of a predetermined angle and sets the phase and the amplitude of the correction signal at which the carrier error component becomes the minimum.

5. The control apparatus according to claim 4, wherein after the carrier amplitude phase corrector sets the phase at which the carrier error component becomes the minimum to the correction signal, it changes the amplitude of the correction signal within an adjustable range and sets the amplitude at which the carrier error component becomes the minimum to be the amplitude of the correction signal.

6. The control apparatus according to claim 1, wherein each of the first phase shifter and the second phase shifter is an all-pass filter including an OP amplifier.

7. The control apparatus according to claim 1, wherein f1=fc/n and f2=fc×n (n is an arbitrary positive real number) are satisfied.

8. The control apparatus according to claim 1, wherein a difference between a phase shift φ1 by the first phase shifter and a phase shift φ2 by the second phase shifter is about 90°.

9. The signal processor according to claim 1, comprising a band pass filter that attenuates a range of the phase modulation signal other than a predetermined frequency range that is centered around the carrier frequency fc.

10. The control apparatus according to claim 1, wherein:

the first phase shifter shifts, for two-phase signals detected from the resolver excited at the carrier frequency fc, the signals differing about 90° in phase from each other, and the second phase shifter shifts a phase of a second phase signal of the resolver, the second phase signal differing about 90° degrees in phase from the first phase signal of the resolver.

11. The control device according to claim 1, wherein:

for four-phase signals having phases mutually different from one another by about 90°, detected by the resolver excited by the carrier frequency fc, the first phase shifter shifts a phase of a signal obtained by synthesizing first and third phase signals of the resolver, the first and third phase signals having phases different from each other by about 180°, and the second phase shifter shifts a phase of a signal obtained by synthesizing second and fourth phase signals of the resolver, the second and fourth phase signals having phases different from each other by about 180°.

\* \* \* \* \*